(12) United States Patent
Kasper

(10) Patent No.: US 6,303,922 B1
(45) Date of Patent: Oct. 16, 2001

(54) RANGE-SWITCHING OPTICAL RECEIVER WITH HIGH SENSITIVITY AND WIDE DYNAMIC RANGE

(75) Inventor: Bryon L. Kasper, San Marino, CA (US)

(73) Assignee: Ortel Corporation, Alhambra, CA (US)

( * ) Notice: Subject to any disclaimer, the term of this patent is extended or adjusted under 35 U.S.C. 154(b) by 0 days.

(21) Appl. No.: 09/120,388

(22) Filed: Jul. 21, 1998

Related U.S. Application Data

(60) Provisional application No. 60/053,267, filed on Jul. 21, 1997.

(51) Int. Cl.[7] .................................................. H01J 40/14
(52) U.S. Cl. ..................... 250/214 A; 333/18; 333/28 R; 330/59
(58) Field of Search ........................... 250/214 A, 214 R; 330/59, 265, 260; 359/189, 194; 333/28 R, 18

(56) References Cited

U.S. PATENT DOCUMENTS

| | | | |
|---|---|---|---|
| 4,723,313 | * | 2/1988 | Folcke et al. ............. 359/189 |
| 5,477,370 | | 12/1995 | Little et al. ............. 359/189 |
| 5,565,672 | | 10/1996 | Siegel et al. ............. 250/214 R |

\* cited by examiner

*Primary Examiner*—Que T. Le
*Assistant Examiner*—Thanh X. Luu
(74) *Attorney, Agent, or Firm*—Christie, Parker & Hale, LLP

(57) ABSTRACT

At least two innovations are used to overcome the limitations of conventional transimpedance or high impedance optical receiver front end amplifiers. The innovations are a) multiple stage equalization of a high-feedback resistor, low-gain transimpedance amplifier to obtain high sensitivity, and b) range switching of feedback resistors and equalization capacitors to obtain high overload. With these approaches, it is possible to design an optical receiver operating at the intrinsic limits of available device technology.

28 Claims, 4 Drawing Sheets

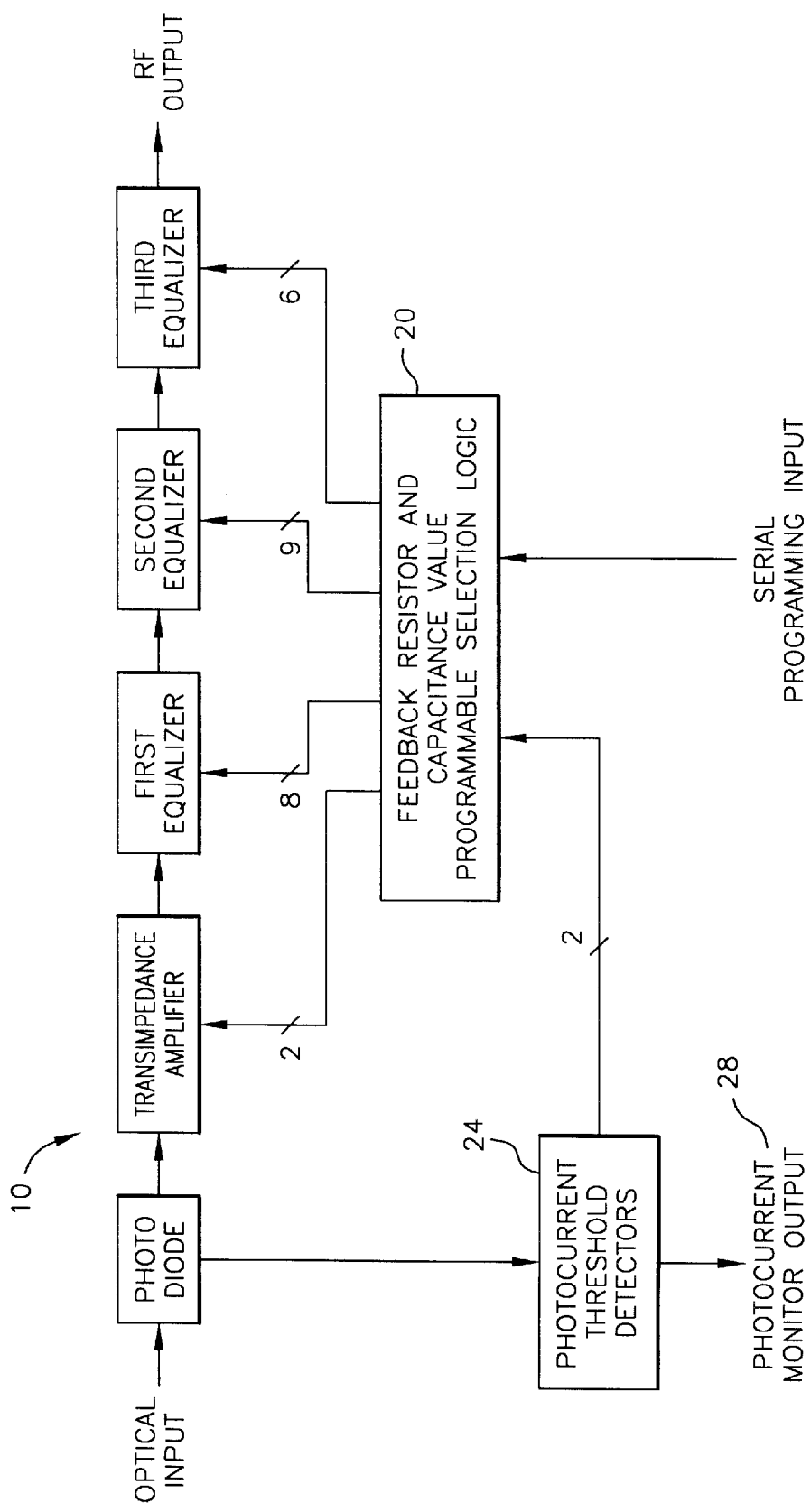

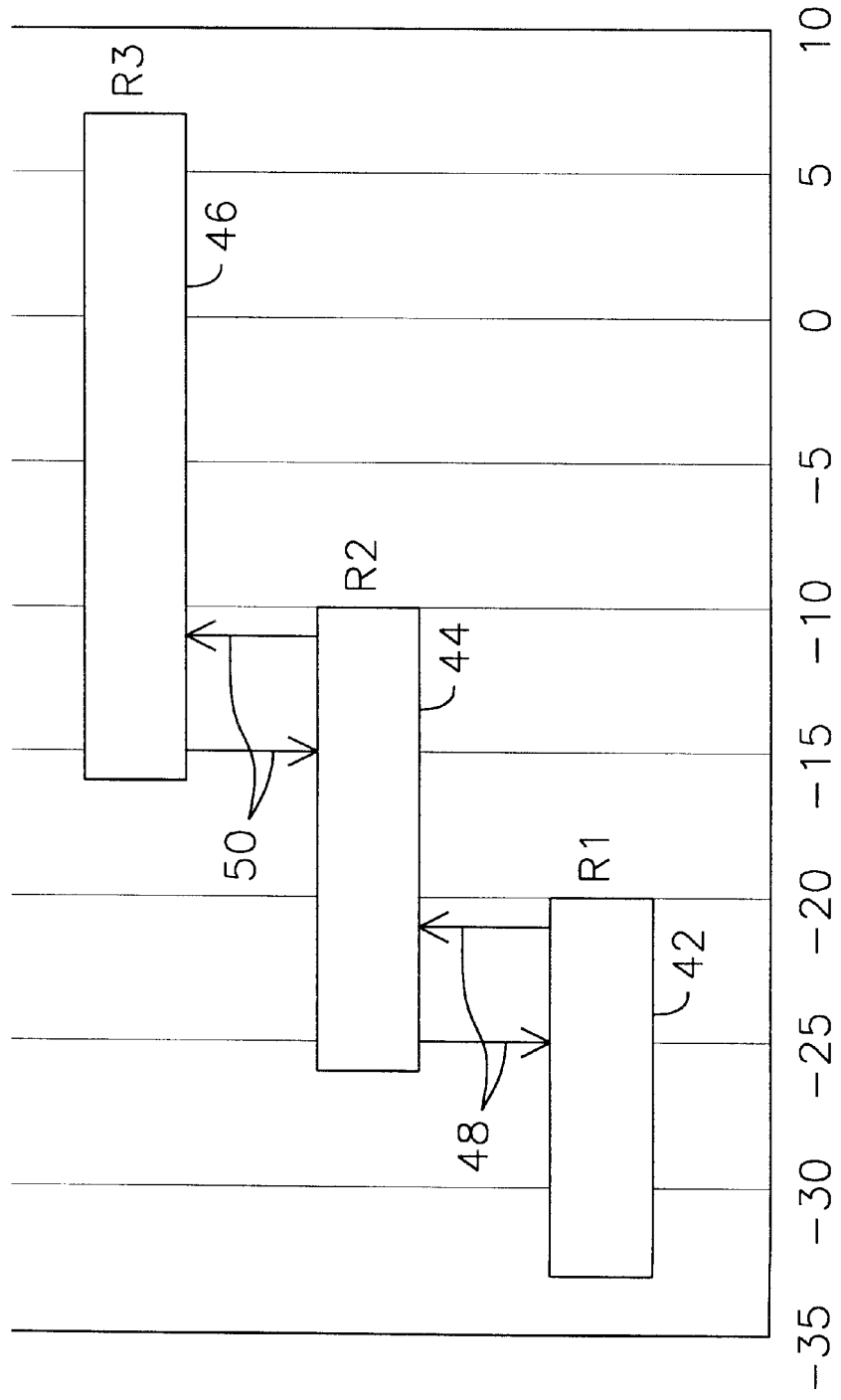

RANGE-SWITCHING OPTICAL RECEIVER WITH HIGH SENSITIVITY AND WIDE DYNAMIC RANGE

This application claims priority to U.S. Provisional Patent Application Ser. No. 60/053,267, entitled "RANGE-SWITCHING OPTICAL RECEIVER WITH HIGH SENSITIVITY AND WIDE DYNAMIC RANGE" filed on Jul. 21, 1997.

FIELD OF THE INVENTION

The present invention relates to optical receivers, and more particularly, to a ranges witching optical receiver that exhibits high sensitivity and wide dynamic range.

BACKGROUND OF THE INVENTION

Front-end amplifiers for optical receivers are traditionally realized in the form of transimpedance amplifiers which provide a good compromise between high sensitivity and wide dynamic range. However, to achieve the best possible performance from new transistor technologies and low capacitance photodiodes, a standard transimpedance amplifier configuration is often not adequate. It would be desirable to have an amplifier that allows very high overload combined with sensitivity that is limited only by the intrinsic noise of the input transistor, thus reaching the theoretical limit for PIN/FET receiver performance.

It is well known that to achieve minimum sensitivity, it is necessary to minimize the input capacitance of an optical receiver, and to maximize the value of feedback resistance in the transimpedance amplifier. The difficulty in accomplishing this in practice comes from the large values of feedback resistors needed. Large feedback resistors cause at least three separate problems:

Overload capability is inversely proportional to the feedback resistor value, hence large resistors reduce dynamic range; and Transimpedance amplifier bandwidth is also inversely proportional to feedback resistor value, hence large resistors reduce bandwidth. Bandwidth can be improved by increasing the open loop gain of the transimpedance amplifier, but the increase in gain is limited by increasing amplifier phase shift which gives rise to frequency response peaking and associated sensitivity degradation; and Shunt capacitance in parallel with the feedback resistor can eventually limit the transimpedance amplifier bandwidth as the feedback resistor value grows.

In the current art, the problem of dynamic range is sometimes overcome by the use of FETs acting as voltage-variable resistors to shunt photocurrent away from the transimpedance amplifier input when high optical signal levels are received. A FET shunt can be configured either a) in parallel with the feedback resistor, or b) as a shunt from the transimpedance amplifier input to ground. With an extremely large feedback resistor and very small input capacitance, the utility of the shunt FET approach is limited. A FET in parallel with the feedback resistor adds shunt capacitance and limits the bandwidth. Bandwidth could potentially be restored by equalization, but nonlinearity of the FET would limit the equalizer's effectiveness. As the shunt is turned on with increasing signal levels, it would be necessary to reduce the open-loop gain of the transimpedance amplifier to prevent peaking. Because of the high open-loop gain needed with a large feedback resistor, the circuit would already be at or beyond the phase shift limit where peaking becomes a problem. The difficulties of matching the shunt FET resistance and open loop gain over temperature, optical power range, and process variation would be extremely formidable.

Alternatively, a shunt FET to ground might be used. However, the ON resistance of this FET would have to be much lower than that of an FET used as a feedback resistor shunt, necessitating a much larger device size. A large FET would add considerable parasitic input capacitance, hence reducing the receiver sensitivity. Calculations have shown an expected degradation of 1.5 dB, which would significantly reduce the range of application of the receiver.

SUMMARY OF THE INVENTION

To overcome these difficulties, the present invention presents a new approach to optical receiver design. In one embodiment, a transimpedance amplifier with very low input capacitance and a very large feedback resistor is used to obtain input-FET-limited sensitivity. Rather than relying on high open-loop gain in the transimpedance amplifier to obtain bandwidth, equalization is used. This avoids frequency response peaking and associated sensitivity degradation. The above combination, usually referred to as a high impedance receiver, is capable of providing the theoretically best sensitivity.

To allow the equalized receiver concept to achieve wide dynamic range, which is the traditional drawback to the high impedance approach, the equalization is split into a number of stages, which reduces the noise added in the equalization process and also improves the overload capability. Feedback resistor and equalizer range switching is also implemented to accommodate very high optical input power levels, hence allowing the receiver to have an overload capability comparable to or better than the best shunt FET transimpedance amplifier designs.

DESCRIPTION OF THE DRAWINGS

These and other features of the present invention will be better understood based on the following/detailed description read in light of the following drawings in which:

FIG. 3 block diagram of the overall receiver including the control circuits; and FIG. 4 illustrates range switching operation for the optical receiver according to the present invention.

DETAILED DESCRIPTION OF THE INVENTION

Figure 1:
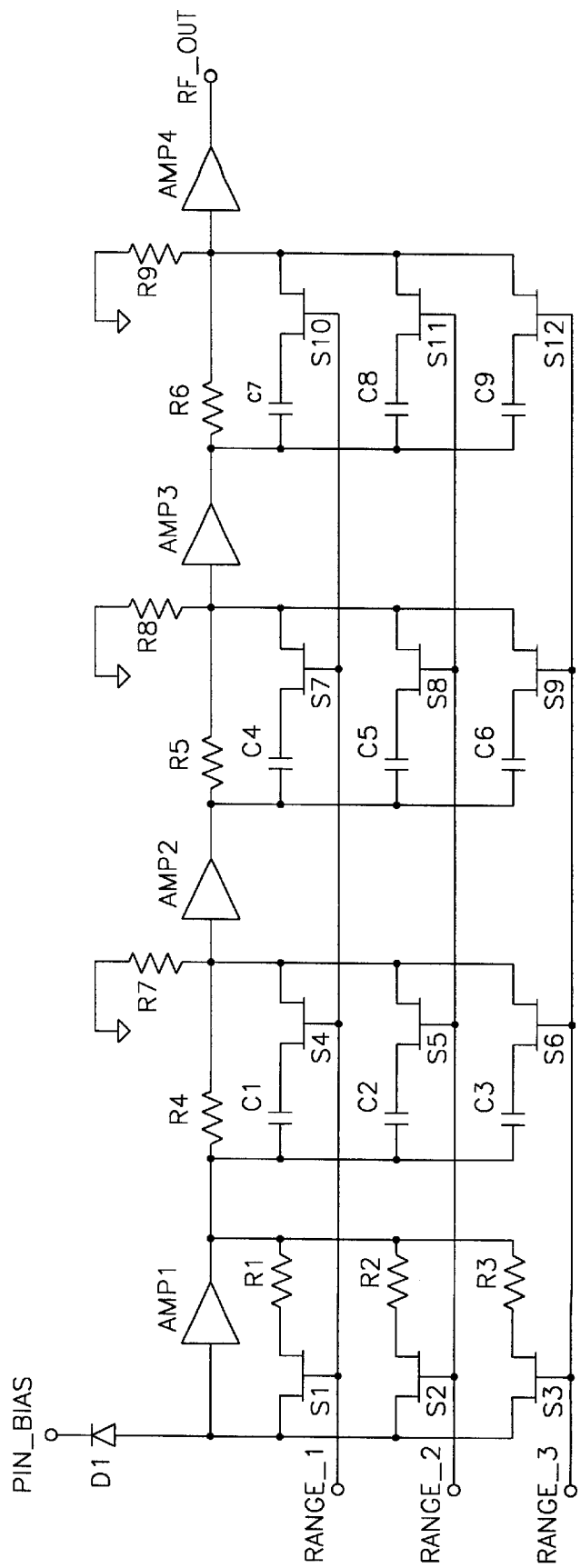
FIG. 1 is a diagram of the range-switching receiver.

Referring to FIG. 1, photodiode D1 is the input PIN detector and AMP1 is the amplifier for the transimpedance input stage. Depending upon the level of input signal being received, one of three feedback resistors (R1, R2, or R3) is selected by the range control inputs RANGE_1 through RANGE_3 via FET switches S1 through S3. If switch S1 is turned ON and both S2 and S3 are turned OFF, then R1 is the active feedback resistor and completes the transimpedance amplifier along with AMP1 and D1.

In an exemplary embodiment, AMP1 has relatively low gain, but correspondingly low phase shift. Because of the low gain, the bandwidth at the transimpedance amplifier output is low and must be increased by equalization. The first equalization stage comprises resistors R4 and R7, capacitor C1 (assuming that switch 84 is ON and switches S5 and S6 are OFF), and wideband amplifier AMP2. Two similar equalization stages associated with AMP3 and AMP4 follow. Each equalizer stage covers a progressively higher band of frequencies, up to the total required bandwidth for the overall receiver.

Previous implementations of high impedance receivers have used only one RC equalizer stage. With only one stage, the choice of where to locate the equalizer in the chain of amplifiers following the front end involves a trade off of sensitivity and overload. If the equalizer is located close to the front end, then it introduces a large amount of low frequency attenuation at a point where signal levels are very small. This results in low frequency noise from following stages becoming significant, and negates the sensitivity benefit of having a large feedback resistor. Conversely, if the equalizer is located further from the front end after the addition of considerable gain, then the low frequency components of the received signal will not have been attenuated by the equalizer and have high amplitude, causing overload of the amplifiers prior to the equalizer. Dynamic range will therefore be limited. Breaking the equalization up into a number of stages with modest gain in each stage avoids both of these difficulties, and prevents the equalizer from being a limiting factor for either sensitivity or overload.

For higher optical power levels, it is necessary to switch to a lower value of feedback resistor to prevent overload of AMP1. This is accomplished by using the control input RANGE_1 to turn off switches S1, S4, S7, and S10, and turning on a different set of switches using either RANGE_2 or RANGE_3. If RANGE_2 is activated, for example, then feedback resistor R2 would be used in the transimpedance amplifier, and capacitors C2, C5, and C8 would be connected in the equalizer stages.

The values of each of the equalizer capacitors should preferably be set precisely to provide pole-zero matching from stage to stage, and to thereby obtain a flat frequency response up to the full bandwidth required from the receiver. In most embodiments the capacitor values will need to be tunable to accomplish this pole-zero matching, and to compensate for IC process variation. One tuning method is to implement the equalizer capacitors as binary arrays, and to use an associated array of FET switches to select the particular capacitor combination to provide the desired overall capacitance. Tuning can then be accomplished digitally by using a programmable logic array in front of each equalizer switch array, and using the RANGE_1 through RANGE_3 control signals as inputs to the logic array. The logic arrays are programmed during manufacture to select the appropriate capacitor combinations to have each equalizer provide the desired amount of equalization needed for each value of feedback resistor.

In many embodiments the feedback resistor switches S1 through S3 need to be more complex than the single FETs shown in FIG. 1 in order to avoid deleterious effects of switch feedthrough capacitance. These switches can be implemented as a standard T arrangement of three FETs driven by complementary control signals in order to reduce feedthrough effects. Switches S4 through S12 may remain as single FETs, with their parasitic capacitance taken into account in the design and tuning of the equalizer capacitor arrays.

Figure 2:
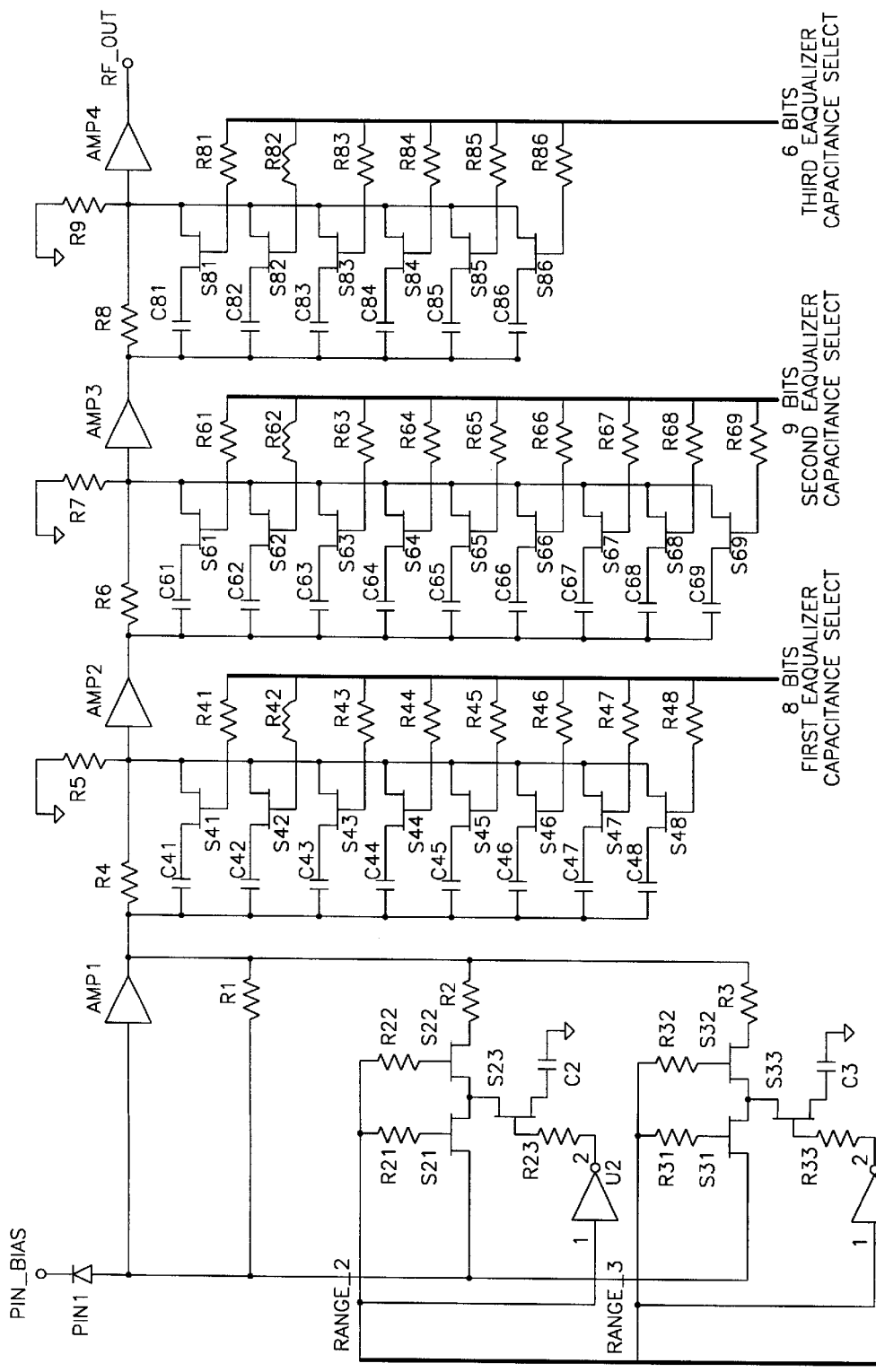
FIG. 2 illustrates two features of the present invention, which are 1) low-feedthrough-capacitance feedback resistor switches, and 2) tunable capacitors implemented as binary arrays.

FIG. 2 illustrates two features of the present invention, which are 1) low-feedthrough-capacitance feedback resistor switches, and 2) tunable capacitors implemented as binary arrays.

The low-feedthrough-capacitance switches can be implemented as standard T-connected arrangements of three FETs. This type of T connection is commonly used in commercial GaAs RF switches. Two such exemplary switches are shown in FIG. 2 in series with feedback resistors R2 and R3. Feedback resistor R1 is the largest of the three feedback resistors, hence does not need to be switched out as lower value resistors are added in parallel. Operation of the switch in series with R2, for example, is as follows:

When control input RANGE_2 is HIGH, FET switches S21 and S22 are turned ON through gate resistors R21 and R22. Resistor R2 is then added in parallel with feedback resistor R1. FET S23 is turned OFF as its gate is driven through resistor R23 by a complementary control signal generated by inverter U2.

When control input RANGE_2 is LOW, FETs S21 and S22 are turned OFF and resistor R2 is disconnected. S23 is turned ON and shorts to ground through capacitor C2 any RF leakage from parasitic capacitance shunting S21 and S22. Without S23, these parasitic capacitances would cause R2 to remain in the feedback path at high frequencies but not at low frequencies, resulting in a non-6 dB-per-octave roll-off in frequency response at the output of AMP1 that could not be properly compensated by the equalizers.

Operation of the switch in series with R3 is similar.

Two alternate arrangements for these switches that will also work to prevent deleterious effects of FET parasitic capacitance include a) eliminating FETs S22 and S32, or b) tying capacitors C2 and C3 to the output of AMP1 rather than to ground. If FET S22, for example, is eliminated altogether and replaced by a direct connection from R2 to S21, then the shunt capacitance of S21 is still shorted to ground by S23 and does not degrade performance. The only drawback of eliminating S22 is that the left side of R2 is then shorted to AC ground through S23, adding some additional loading to the output of AMP1. This loading should not have a significant effect on circuit performance. The case for R3 if S32 is eliminated is similar.

Tying capacitors C2 and C3 to the output of AMP1 instead of ground would cause the shunt capacitances of S21 and S3, when these switches are turned OFF, to appear as feedback capacitances in parallel with R1. This can be expected to reduce the bandwidth of the receiver somewhat, but would probably not be of significant concern as this bandwidth difference can be compensated by adjustment of the equalizers.

A preferred embodiment is shown in FIG. 2 with three FETs per switch and capacitors C2 and C3 tied to ground.

Capacitor arrays that allow low-cost digital tuning of the equalizers are also shown in FIG. 2. The first equalizer, for example, resides between amplifiers AMP1 and AMP2, and consists of resistors R4 and R5 plus a tunable capacitor in parallel with R4 implemented as a switched array. The desired capacitance value is created by paralleling a selected combination of capacitors C41 through C48, using FET switches S41 through S48. Selection is done by eight digital control lines tied to the gates of the switches through resistors R41 through R48. The values of capacitors C41 through C48 are arranged to increase in a binary fashion, such that C42=2×C41, C43=4×C41, up to C48=128×C41. By the application of an appropriate 8-bit digital code, any capacitance value from zero to 255×C41 can be selected, in increments of C41. (In reality, parasitic shunt capacitance of the switches prevents zero capacitance from being attainable. As zero capacitance is not expected to be needed in practical embodiments as one of the selected values, this should not be a concern. More elaborate T-connected switches as described above for the feedback resistors should not be required.)

Analysis of performance penalties from pole-zero matching errors has shown that the highest resolution is needed for the mid-frequency-range equalizer (between AMP2 and AMP3), whereas the lowest resolution is needed for the high-frequency-range equalizer (between AMP3 and AW4). The numbers of bits of capacitance resolution required for each equalizer is as shown in FIG. 2.

The actual capacitance values and associated digital codes for each equalizer are selected during the manufacturing process to provide for the flattest possible frequency response, hence lowest baseline wander and intersymbol interference and highest receiver sensitivity.

Control of the RANGE inputs is accomplished using an external control circuit. The control circuit could use some measure of the optical received power such as the photocurrent in D1 as the basis for deciding what range should be selected. It is desirable to implement a large amount of hysteresis in the switching points between ranges to avoid chatter near a switching threshold.

A block diagram of the overall receiver 10 including exemplary control circuits is shown in FIG. 3. Digital codes for selecting the feedback resistors and associated equalizer capacitor values are generated by a programmable digital logic device 20, which acts as a simple look-up table. The address input to the look-up table comes from a pair of photocurrent threshold detectors 24, which are preferably comparators that determine whether the PIN detector photocurrent is above or below preset thresholds that set the optical power levels at which the receiver switches operating ranges. The comparators include hysteresis to prevent chatter when the photocurrent crosses a switching threshold. If desired, a photocurrent monitor output 28 as shown in FIG. 2 may optionally be provided to allow a user to measure received optical power levels during operation.

The logic device may be programmed through serial programming lines to minimize the number of external leads required. Programnning need be done only once, during receiver manufacture. Programming can readily be accomplished using an electrically-erasable programmable logic device, as supplied by a number of IC vendors such as Lattice Semiconductor.

Range switching operation can be illustrated by referring to FIG. 4. The horizontal bars 42, 44, 46 in this figure show typical ranges of optical power over which the receiver might operate with each feedback resistor value, R1 through R3. The arrows 48, 50 between the bars show the thresholds at which the receiver is designed to switch to an alternate range. For example, if the received signal power was initially below -25 dBm, the control circuit would select feedback resistor R1, and the programmable logic would select capacitor combinations appropriate to equalize the transimpedance amplifier bandwidth with only R1 in the feedback path. If during operation the optical power level increases to a level above –21 dBm, say –18 dBm, the lower-level threshold detector switches and changes its input to the programmable logic device. The logic then causes feedback resistor R2 to be added to the feedback path, and changes the equalizer capacitors to new values appropriate to a feedback resistance of R2 in parallel with R1. The lower value of feedback resistance reduces the output voltage swing from AMP1, and prevents it from overloading below an optical input power of −10 dBm.

Similarly, if the received power level increases above −11 dBm, the high-level threshold detector switches, adding the lowest value resistor R3 in parallel with R1 plus causing appropriate revaluation of the equalizer capacitors. The receiver overload point would now be increased to +7 dBm.

For decreasing optical power levels, the threshold detector switching points are indicated by the down arrows between ranges. The switching points for decreasing power and increasing power are offset from one another by having hysteresis in the set points of the threshold detectors. This hysteresis prevents range switching chatter, and is also reduces the number of range switching events that occur over the life of the receiver.

Those skilled in the art would readily appreciate that various modifications could be made to the subject matter described above without departing from the spirit and scope of the present invention

What is claim is:

1. An optical receiver comprising: a photodiode for receiving an optical input signal;
   a transimpedance amplifier coupled to the photodiode, wherein said transimpedance amplifier includes one or more feedback resistors;
   a plurality of equalization stages coupled to the transimpedance amplifier, wherein each of the plurality of equalization stages includes one or more equalization capacitors; and
   means for range switching between said one or more feedback resistors to control loop gain of said transimpedance amplifier and between said one or more equalization capacitors of each of said equalization stages to provide pole zero matching from stage to stage.

2. The optical receiver of claim 1 wherein each of the plurality of equalization stages includes one or more equalization resistors.

3. The optical receiver of claim 1 wherein said means for range switching comprises one or more micro switches, sensitive to range control inputs.

4. The optical receiver of claim 3 wherein said micro switches are FETs.

5. The optical receiver of claim 1 wherein said equalization capacitors are tunable to provide said pole zero matching from stage to stage to provide a flat frequency response across bandwidth of said receiver.

6. The optical receiver of claim 5 wherein said tunable equalization capacitors comprise a binary array of parallel capacitors having an associated array of micro switches to enable selection of a particular capacitor combination to provide a desired overall capacitance.

7. The optical receiver of claim 6 further comprising programable logic having a multibit control code for selecting said particular capacitor combination.

8. The optical receiver of claim 1 wherein said means for range switching comprises programmable selection logic for selecting between said one or more feedback resistors and said one or more equalization capacitors.

9. The optical receiver of claim 8 wherein said receiver further comprises one or more photocurrent threshold detectors that compare a characteristic of said optical input signal to one or more switching thresholds, wherein said programmable selection logic selects between said feedback resistors and said equalization capacitors in accordance with said comparison.

10. The optical receiver of claim 3 wherein the microswitches comprise a T arrangement of FETs driven by a complementary control signal to reduce feed through capacitance of the micro-switches.

11. The optical receiver of claim 3 further comprising a control circuit, sensitive to power of said optical input signal for deciding what range of feedback resistance and equalization capacitance should be selected.

12. A method for amplifying a received optical signal over a broad bandwidth and wide dynamic range comprising:

detecting characteristic of the received optical signal;

adjusting a feedback resistance of a transimpedance amplifier and an equalization capacitance of each of a plurality of equalization stages in accordance with said detected characteristic;

amplifying said received optical signal with said transimpedance amplifier;

equalizing said amplified received signal with said plurality of equalization stages.

13. The method of claim 12 wherein said step of adjusting said equalization capacitance of each of said plurality of equalization stages comprises tuning said equalization capacitors to provide pole zero matching from stage to stage.

14. The method of claim 13 wherein said step of tuning said equalization capacitors comprises selecting a combination of parallel capacitors to provide a desired overall capacitance.

15. The method of claim 14 further comprising selecting said particular capacitor combination with programable logic having a multi-bit control code.

16. An optical receiver comprising:

a photodiode for receiving an optical input signal;

a transimpedance amplifier coupled to the photodiode, wherein said transimpedance amplifier comprises a plurality of feedback resistors;

one or more feedback micro-switches for range switching between the plurality of feedback resistors;

a plurality of equalization stages coupled to output of the transimpedance amplifier to extend bandwidth of the receiver; and one or more equalization micro-switches for range switching each equalization stage to provide pole-zero matching between said plurality of equalization stages.

17. The optical receiver of claim 16 wherein said feedback micro-switches comprise FETs, responsive to range control inputs.

18. The optical receiver of claim 16 wherein said feedback micro-switches comprise a T arrangement of FETs driven by a complementary control signal to reduce feed through capacitance of the micro-switches.

19. The optical receiver of claim 16 wherein said equalization micro-switches comprise FETs, responsive to range control inputs.

20. The optical receiver of claim 16 wherein said equalization capacitors are tunable to provide said pole zero matching from stage to stage.

21. The optical receiver of claim 20 wherein said tunable equalization capacitors comprise a binary array of parallel capacitors coupled to said one or more equalization microswitches to enable selection of a particular capacitor combination to provide a desired overall capacitance.

22. The optical receiver of claim 16 further comprising a control circuit, sensitive to received power of said optical input signal for controlling said feedback micro-switches and said equalization micro-switches.

23. An optical receiver, comprising:

a photodiode for receiving an optical input signal;

a transimpedance amplifier coupled to the photodiode, wherein said transimpedance amplifier comprises a plurality of feedback resistors;

a plurality of equalization stages coupled to the transimpedance amplifier, wherein each of the plurality of equalization stages includes one or more equalization capacitors;

programmable selection logic for selecting between said one or more feedback resistors and said one or more equalization capacitors in each of said equalization stages.

24. The optical receiver of claim 23 further comprising one or more photocurrent threshold detectors that compare a characteristic of said optical input signal to one or more switching thresholds wherein said programmable selection logic selects between said feedback resistors and said equalization capacitors in accordance with said threshold comparison.

25. The optical receiver of claim 24 wherein said photocurrent threshold detector compares photocurrent of said photodiode to one or more switching thresholds wherein said programmable selection logic selects between said feedback resistors and said equalization capacitors in accordance with said threshold comparison.

26. The optical receiver of claim 23 further comprising one or more feedback micro-switches, programmable selection logic for selecting between said one or more feedback resistors.

27. The optical receiver of claim 26 wherein said feedback micro-switches comprise FETs.

28. The optical receiver of claim 26 wherein said feedback micro-switches comprise a T arrangement of FETs driven by a complementary control signal from said programmable selection logic to reduce feed through capacitance of the micro-switches.

* * * * *